(12) United States Patent
Lin et al.

(10) Patent No.: US 9,607,704 B2
(45) Date of Patent: Mar. 28, 2017

(54) DATA READING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); Tien-Ching Wang, Kaohsiung (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 21 days.

(21) Appl. No.: 14/682,123

(22) Filed: Apr. 9, 2015

(65) Prior Publication Data

US 2016/0247575 A1 Aug. 25, 2016

(30) Foreign Application Priority Data

Feb. 25, 2015 (TW) .............................. 104106033 A

(51) Int. Cl.
| | | |
|---|---|---|
| *G11C 29/00* | (2006.01) | |
| *G11C 16/26* | (2006.01) | |
| *G06F 11/10* | (2006.01) | |
| *G11C 7/10* | (2006.01) | |
| *G11C 29/04* | (2006.01) | |

(52) U.S. Cl.
CPC .......... *G11C 16/26* (2013.01); *G06F 11/1048* (2013.01); *G11C 7/1006* (2013.01); *G11C 2029/0411* (2013.01)

(58) Field of Classification Search
CPC ..... G11C 16/26; G11C 16/08; G11C 16/0483; G11C 29/52; G06F 11/1068
See application file for complete search history.

(56) References Cited

U.S. PATENT DOCUMENTS

| | | | |
|---|---|---|---|
| 2013/0073924 A1* | 3/2013 | D'Abreu .............. | G06F 11/1048 714/763 |
| 2015/0095736 A1* | 4/2015 | Leem .................... | G06F 11/141 714/758 |

* cited by examiner

*Primary Examiner* — Sam Rizk
(74) *Attorney, Agent, or Firm* — Jianq Chyun IP Office

(57) ABSTRACT

A data reading method is provided. The data reading method includes receiving a read command from a host system; sending a first read command sequence to obtain a first data string from memory cells of a rewritable non-volatile memory module; performing a decoding procedure on the first data string to generate a decoded first data string; and, if there is an error bit in the decoded first data string, sending a second read command sequence to obtain a second data string from the memory cells, performing a logical operation on the decoded first data string and the second data string to obtain an adjusting data string, adjusting the decoded first data string according to the adjusting data string to obtain an adjusted first data string, and using a data string obtained after re-performing the decoding procedure on the adjusted first data string as the decoded first data string.

18 Claims, 16 Drawing Sheets

| DB8 | DB16 | DB24 | DB32 |
|---|---|---|---|
| DB7 | DB15 | DB23 | DB31 |
| DB6 | DB14 | DB22 | DB30 |
| DB5 | DB13 | DB21 | DB29 |
| DB4 | DB12 | DB20 | DB28 |
| DB3 | DB11 | DB19 | DB27 |
| DB2 | DB10 | DB18 | DB26 |
| DB1 | DB9 | DB17 | DB25 |

DATA READING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 104106033, filed on Feb. 25, 2015. The entirety of the above-mentioned patent application is hereby incorporated by reference herein and made a part of this specification.

BACKGROUND

Technical Field

The present invention relates to a data reading method, and more particularly, to a data reading method for a rewritable non-volatile memory, a memory controlling circuit unit, and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Generally, data written to the rewritable non-volatile memory module is encoded according to an error correcting code, and data read from the rewritable non-volatile memory module is also decoded through a corresponding procedure. However, a correcting capability of the error correcting code has its limit. For example, when the error correcting code is implemented by using a turbo code algorithm or a low density parity code algorithm in an iterative manner, as the number of times for performing an iteration decoding reaches a specific number of times, a phenomenon where the number of error bits is not reduced with increases in the number of times for performing the iteration decoding may occur in the subsequent process of the iteration decoding. This phenomenon is also known as the error floor. Accordingly, it is one of the major subjects in the industry as how to successfully decode the read data in order to obtain original data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a data reading method, a memory controlling circuit unit and a memory storage device, which are capable of reducing occurrence of the error floor and increasing the correctness in reading data.

An exemplary embodiment of the present invention provides a data reading method for a rewritable non-volatile memory module, wherein the rewritable non-volatile memory module includes a plurality of memory cells. The data reading method includes: receiving a read command from a host system, wherein the read command instructs to read data from a plurality of first memory cells among the memory cells; sending a first read command sequence to obtain a first data string from the first memory cells; and performing a decoding procedure on the first data string to generate a decoded first data string. The data reading method further includes: if there is no error bit in the decoded first data string, using the decoded first data string as a corrected data to be sent to the host system in response to the read command. Further, if there is an error bit in the decoded first data string, sending a second read command sequence to obtain a second data string from the first memory cells, performing a logical operation on the decoded first data string and the second data string to obtain an adjusting data string, adjusting the decoded first data string according to the adjusting data string to obtain an adjusted first data string, and using a data string obtained after re-performing the decoding procedure on the adjusted first data string as the decoded first data string.

An exemplary embodiment of the present invention provides a memory controlling circuit unit configured to control a rewritable non-volatile memory module. The memory controlling circuit unit includes a host interface, a memory interface and a memory management circuit. The host interface is configured to couple to a host system. The memory interface is configured to couple to the rewritable non-volatile memory module, wherein the rewritable non-volatile memory module includes a plurality of memory cells. The memory management circuit is coupled to the host interface and the memory interface. The memory management circuit is configured to receive a read command from the host system, wherein the read command instructs to read data from a plurality of first memory cells among the memory cells. The memory management circuit is further configured to send a first read command sequence to obtain a first data string from the first memory cells, and perform a decoding procedure on the first data string to generate a decoded first data string. If there is no error bit in the decoded first data string, the memory management circuit is further configured to use the decoded first data string as a corrected data to be sent to the host system in response to the read command. If there is an error bit in the decoded first data string, the memory management circuit is further configured to send a second read command sequence to obtain a second data string from the first memory cells, perform a logical operation on the decoded first data string and the second data string to obtain an adjusting data string, adjust the decoded first data string according to the adjusting data string to obtain an adjusted first data string, and use a data string obtained after re-performing the decoding procedure on the adjusted first data string as the decoded first data string.

An exemplary embodiment of the present invention provides a memory storage device, which includes a connection interface unit, a rewritable non-volatile memory module and a memory controlling circuit unit. The connection interface unit is configured to couple to a host system. The rewritable non-volatile memory module includes a plurality of memory cells. The memory controlling circuit unit is coupled to the connection interface unit and the rewritable non-volatile memory module. The memory controlling circuit unit is configured to receive a read command from the host system, wherein the read command instructs to read data from a plurality of first memory cells among the memory cells. The memory controlling circuit unit is further configured to send a first read command sequence to obtain a first data string from the first memory cells, and perform a decoding procedure on the first data string to generate a decoded first data string. If there is no error bit in the decoded first data string, the memory controlling circuit unit is further configured to use the decoded first data string as a corrected data to be sent to the host system in response to the read command. Further, if there is an error bit in the decoded first data string, the memory controlling circuit unit is further configured to send a second read command sequence to obtain a second data string from the first memory cells, perform a logical operation on the decoded first data string and the second data string to obtain an adjusting data string, adjust the decoded first data string according to the adjusting data string to obtain an adjusted first data string, and use a data string obtained after re-performing the decoding procedure on the adjusted first data string as the decoded first data string.

Based on the above, other than using the block turbo code for the encoding procedure to protect the data, the data reading method, the memory controlling circuit unit and the memory storage device as provided in the present invention are capable of re-performing the decoding on the data which are not successfully decoded by reading the data again during the process of decoding in order to successfully decode and read the data, so as to improve the correctness in reading data and the protection capability for the stored data.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8 to FIG. 17 are schematic diagrams illustrating the decoding procedure performed by using the block turbo code according to an exemplary embodiment.

DESCRIPTION OF THE EMBODIMENTS

Figure 1:
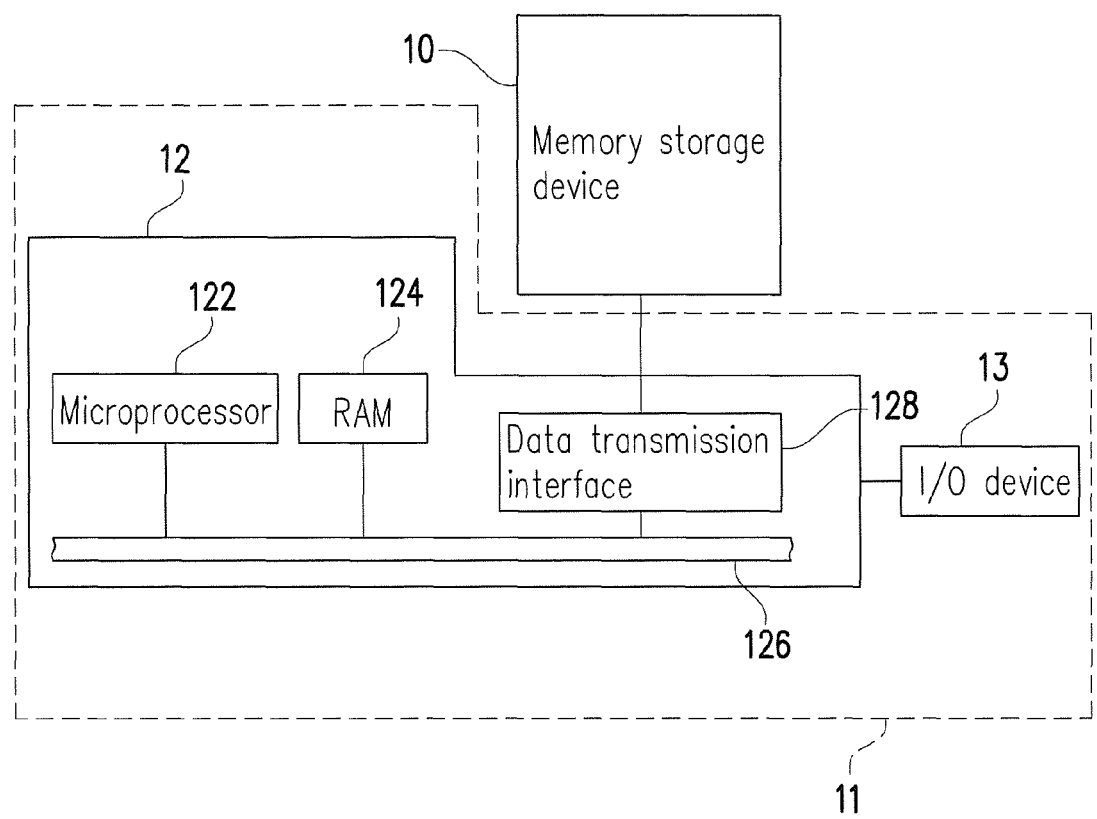
FIG. 1 is a schematic diagram illustrating a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
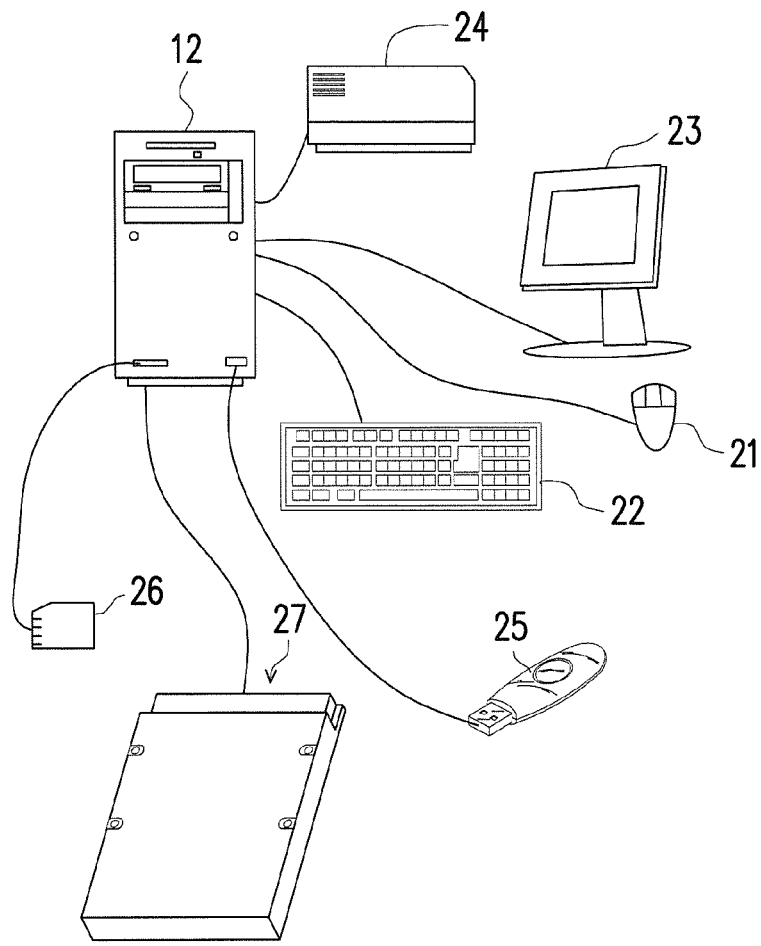
FIG. 2 is a schematic diagram of a computer, an input/output device, and a memory storage device according to an exemplary embodiment.

FIG. 1 is a schematic diagram illustrating a host system and a memory storage device according to an exemplary embodiment, and FIG. 2 is a schematic diagram of a computer, an input/output device, and a memory storage device according to an exemplary embodiment.

Referring to FIG. 1, a host system 11 includes a computer 12 and an input/output (I/O) device 13. The computer 12 includes a microprocessor 122, a random access memory (RAM) 124, a system bus 126, and a data transmission interface 128. For example, the I/O device 13 includes a mouse 21, a keyboard 22, a display 23 and a printer 24 as shown in FIG. 2. It should be understood that the devices illustrated in FIG. 2 are not intended to limit the I/O device 13, and the I/O device 13 may further include other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
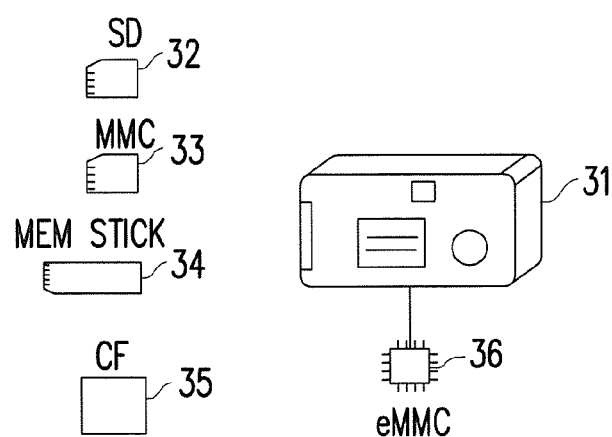
FIG. 3 is a schematic diagram illustrating a host system and a memory storage device according to an exemplary embodiment.

FIG. 3 is a schematic diagram illustrating a host system and a memory storage device according to an exemplary embodiment of the invention.

Generally, the host system 11 may substantially be any system capable of storing data with the memory storage device 10. Even though the host system 11 is illustrated as a computer system in the present exemplary embodiment, however, in another exemplary embodiment of the present invention, the host system 11 may be a digital camera, a video camera, a telecommunication device, an audio player, or a video player. For example, when the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 includes an embedded MMC (eMMC). It should be mentioned that the eMMC is directly coupled to a substrate of the host system.

Figure 4:
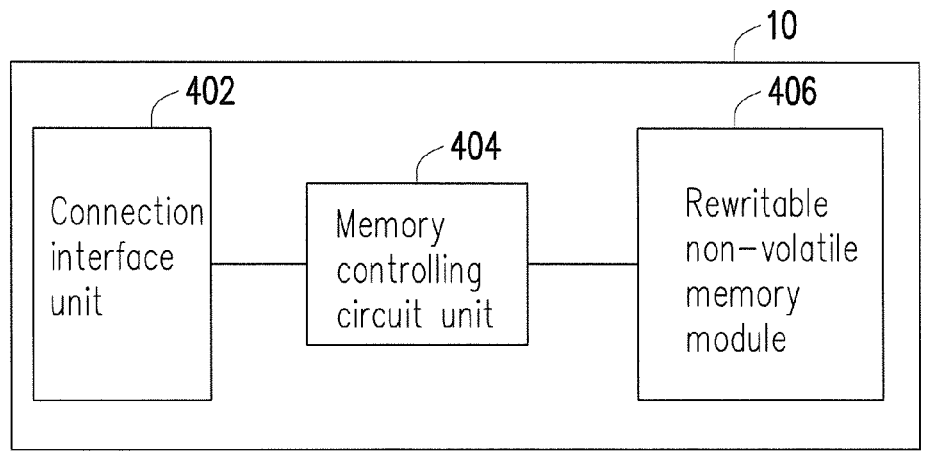
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 includes a connection interface unit 402, a memory controlling circuit unit 404 and a rewritable non-volatile memory module 406. The rewritable non-volatile memory storage module 406 includes multiple physical erasing units 410(0) to 410(N).

In the present exemplary embodiment, the connection interface unit 402 is compatible with a serial advanced technology attachment (SATA) standard. However, the invention is not limited thereto, and the connection interface unit 402 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory stick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form, so as to execute operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a Single Level Cell (SLC) NAND flash memory module, a Multi Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Figure 5:
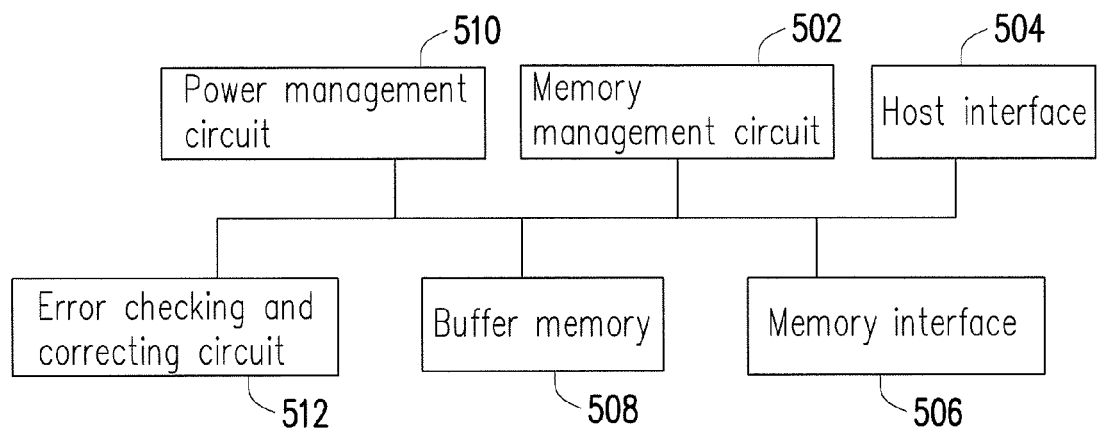
FIG. 5 is a schematic block diagram illustrating a rewritable non-volatile memory module according to an exemplary embodiment.

FIG. 5 is a schematic block diagram illustrating the memory controlling circuit unit according to an embodiment of the invention.

Referring to FIG. 5, the memory controlling circuit unit 404 includes a memory management circuit 502, a host interface 504, a memory interface 506, a buffer memory 508, a power management circuit 510, and an error checking and correcting (ECC) circuit 512.

The memory management circuit 502 is configured to control overall operations of the memory controlling circuit unit 404. Specifically, the memory management circuit 502 has a plurality of control commands. During operations of the memory storage device 100, the control commands are executed to execute various operations such as writing, reading and erasing data.

In the present exemplary embodiment, the control commands of the memory management circuit 502 are implemented in a form of a firmware. For instance, the memory management circuit 502 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment of the invention, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). Particularly, the read only memory has an activate code, which is executed by the microprocessor unit to load the control commands stored in the rewritable non-volatile memory module 406 to the random access memory of the memory management circuit 502 when the memory controlling circuit unit 404 is enabled. Thereafter, the control commands are executed by the microprocessor unit to execute operations of writing, reading or erasing data.

Further, in another exemplary embodiment of the invention, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are electrically connected to the microprocessor. The memory management circuit is configured to manage the physical erasing units of the rewritable non-volatile memory module 406; the memory writing circuit is configured to issue a write command to the rewritable non-volatile memory module 406 in order to write data into the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

The host interface 504 is electrically connected to the memory management circuit 502 and configured to receive and identify commands and data sent from the host system 1000. In other words, the commands and data sent from the host system 1000 are passed to the memory management circuit 502 through the host interface 504. In the present exemplary embodiment, the host interface 504 is compatible with the SATA standard. However, it should be understood that the present invention is not limited thereto, the host interface 504 may also be compatible with a PATA standard, an IEEE 1394 standard, a PCI Express standard, a USB standard, a UHS-I standard, a UHS-II standard, a MS standard, a MMC standard, a CF standard, an IDE standard, or other suitable standards for data transmission.

The memory interface 506 is electrically connected to the memory management circuit 502 and configured to access the rewritable non-volatile memory module 406. In other words, data to be written to the rewritable non-volatile memory module 406 is converted to a format acceptable to the rewritable non-volatile memory module 406 through the memory interface 506. Specifically, if the memory management circuit 502 intends to access the rewritable non-volatile memory module 406, the memory interface 506 sends corresponding command sequences. The command sequences may include one or more signals, or data from the bus. For example, in a read command sequence, information such as identification codes and memory addresses are included.

The buffer memory 508 is electrically connected to the memory management circuit 502 and configured to temporarily store data and commands from the host system 1000 or data from the rewritable non-volatile memory module 406. The memory controlling circuit unit 404 arranges to temporarily store the data from the host system 1000 or the data from the rewritable non-volatile memory module 406 into the buffer memory 508, so that the data may be organized to become a size of a predetermined unit or a size of a transmission unit, and then written into the rewritable non-volatile memory module 406 or sent back to the host system. In addition, the buffer memory 508 may also temporarily store system management data (e.g., a file allocation table or a mapping table) used by the memory controlling circuit unit 404.

The power management unit 510 is electrically connected to the memory management circuit 502 and configured to control a power of the memory storage device 100.

The error checking and correcting circuit 512 is electrically connected to the memory management circuit 502 and configured to perform an error checking and correcting process to ensure the correctness of data. Specifically, when the memory management circuit 502 receives the write command from the host system 1000, the error checking and correcting circuit 512 performs an encoding procedure on the data corresponding to the write command to generate an error correcting code (ECC) or an error detecting code (EDC), and the memory management circuit 502 writes the data corresponding to the write command and the corresponding ECC or the EDC into the rewritable non-volatile memory module 406. Subsequently, when the memory management circuit 502 reads the data from the rewritable non-volatile memory module 406, the corresponding ECC and/or the EDC are also read, and the error checking and correcting circuit 512 executes a decoding procedure on the read data according to the ECC and/or the EDC.

As described above, the error checking and correcting circuit 512 of the memory storage device 100 is configured to verify whether the data stored in the rewritable non-volatile memory module 406 is correct. However, when an error correcting procedure is executed in either the encoding step or the decoding step, the error checking and correcting circuit 512 needs to clearly know of a data length to be protected, so as to calculate for a correct feature code in order to check a correct location wherein the error occurs and accordingly correct an error bit. In the present exemplary embodiment, when the memory controlling circuit unit 404 (or the memory management circuit 502) receives the data, the memory controlling circuit unit 404 (or the memory management circuit 502) first divides the data into a plurality of code frames, and then the error checking and connecting circuit 512 performs the encoding procedure to generate the ECC code for each of the code frames, so that the frames codes and the respective corresponding ECC code may be encoded to from an error checking and correcting code frame. Herein, the size of the error checking and correcting code frame is divided according to the size of the transmission unit, and the size of the transmission unit is decided according to a specification (e.g., the number of bits to be protected by each transmission unit) of the rewritable non-volatile memory module 406. For example, in the case where the transmission unit is 512 bytes and 12 bits are to be protected, the memory controlling circuit unit 404 (or the memory management circuit 502) divides the data into 512 bytes per unit. The error checking and correcting circuit 512 performs the encoding procedure for every 512 bytes of the data, such that the size of each of the generated error checking and correcting code frames is 512 bytes accordingly. Nevertheless, it should be understood that the present invention is not limited thereto. In another exemplary embodiment, the size of the error checking and correcting code frame may also be 1K bytes, 2K bytes, etc.

In the present exemplary embodiment, the memory controlling circuit unit 404 (or the memory management circuit 502) decodes the data on unit basis of the error checking and correcting code frame in order to read the data. For instance, it is assumed that the memory controlling circuit unit 404 (or the memory management circuit 502) receives a read command from the host system, and the read command instructs to read data from a plurality of memory cells (also known as first memory cells) in the rewritable non-volatile memory module 406. In the present exemplary embodiment, it is assumed that the data to be read is divided into one error checking and correcting code frame and stored into the first memory cells. Accordingly, the memory controlling circuit unit 404 (or the memory management circuit 502) sends a read command sequence (also known as a first read command sequence) to the rewritable non-volatile memory module 406 to obtain a data string (also known as a first data string) from the first memory cells storing the error checking and correcting code frame corresponding to the data to be read, performs the decoding procedure on the first data string to generate a corrected data that is successfully decoded and corresponding to the data to be read, and sends the corrected data back to the host system in response to the read command. It should be noted that, if the data to be read is divided into two or more error checking and correcting code frames, the memory controlling circuit unit 404 (or the memory management circuit 502) reads each of the data strings corresponding to the error checking and correcting code frames, performs the decoding procedure on the read data strings, merges the data strings into the corrected data after successfully correcting the read data strings, and sends the corrected data back to the host system in response to the read command.

Figure 6:
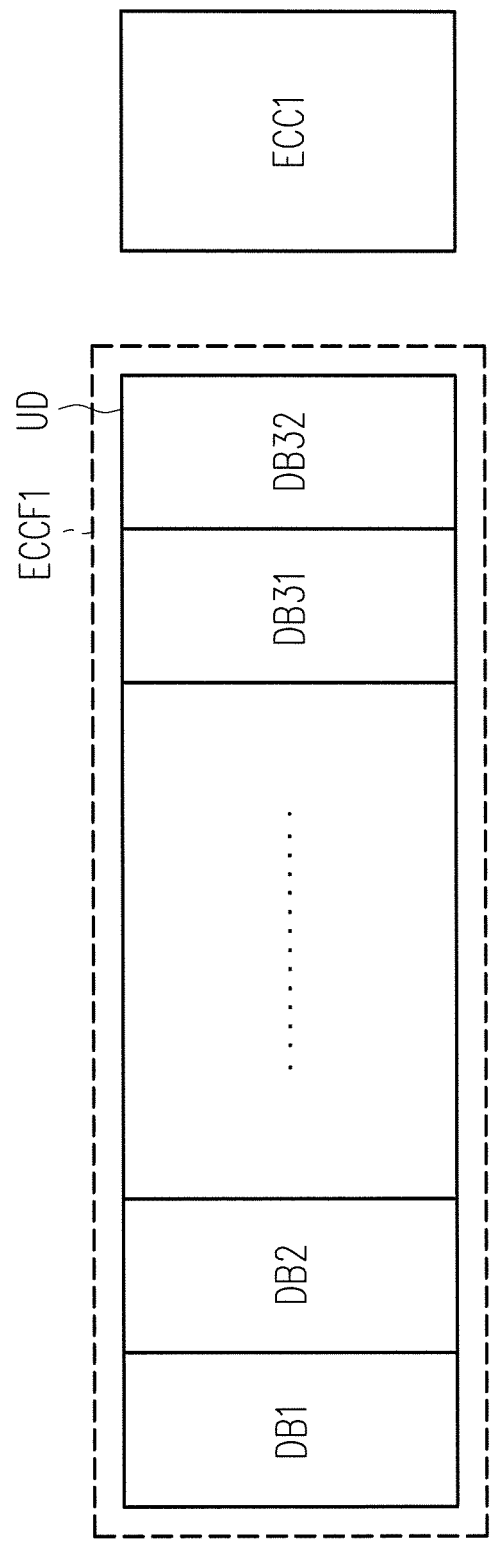
FIG. 6 is a schematic diagram illustrating an error checking and correcting code frame according to an exemplary embodiment.
Figure 7:
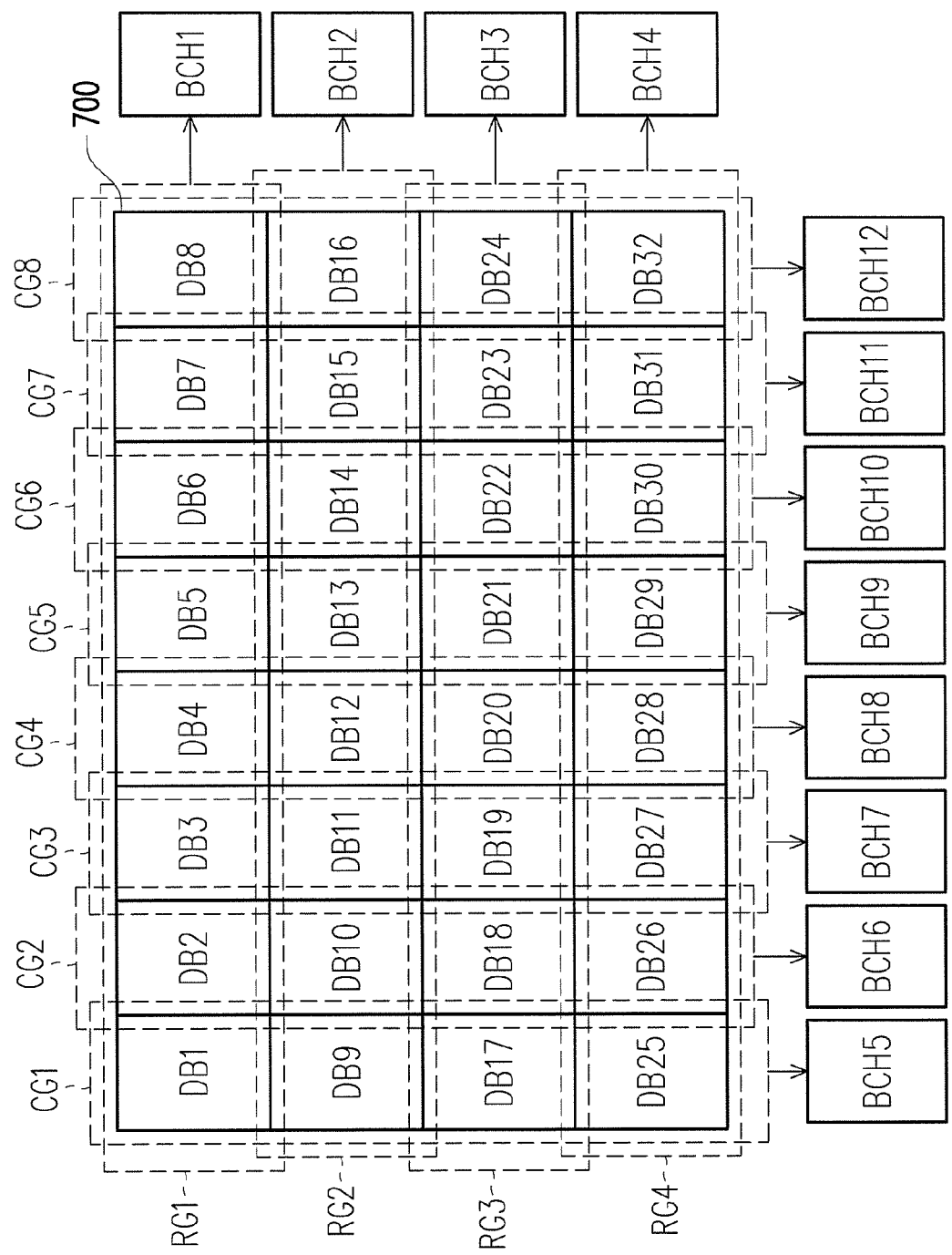
FIG. 7 is a schematic diagram illustrating the encoding procedure performed by using the block turbo code according to an exemplary embodiment.

In the present exemplary embodiment, the error checking and correcting circuit 512 uses a block turbo code (BTC) to perform the encoding/decoding procedure. FIG. 6 is a schematic diagram illustrating an error checking and correcting code frame according to an exemplary embodiment, and FIG. 7 is a schematic diagram illustrating the encoding procedure performed by using the block turbo code according to an exemplary embodiment. It should be understood that terms, such as "select," "divide," "group," "associate," "arrange" and so forth, are logical concepts which describe operations of the error checking and correcting circuit 512 for the data. That is to say, a storage position of the data processed by the error checking and correcting circuit 512 is not changed, and instead, the operations are logically performed on the data.

Referring to FIG. 6, it is assumed that the error checking and correcting circuit 512 performs the encoding procedure on data UD, and the data UD is divided into one error checking and correcting code frame ECCF1 for the encoding procedure. Herein, the error checking and correcting code frame ECCF1 is stored into a plurality of memory cells (also known as the first memory cells). In the present exemplary embodiment, the error checking and correcting circuit 512 performs the encoding procedure on the data UD by using a block turbo code algorithm, groups the data UD into a plurality of data groups, and encodes each of the data groups in order to obtain an error checking and correcting code ECC1 corresponding to the error checking and correcting code frame ECCF1.

Referring to FIG. 6 and FIG. 7, for instance, the error checking and correcting circuit 512 first divides the data UD into a plurality of data bits, such as data bits DB1 to DB32 depicted in FIG. 6. It should be noted that, in the present exemplary embodiment, for clarity of the description, each of the data bits includes only one bit data, but the present invention is not limited thereto. For example, in other embodiments, each of the data bits may also include two or more than two bit data.

Subsequently, the error checking and correcting circuit 512 arranges the data bits DB1 to DB32 into a two dimensional (in row and column directions) data matrix of 8×4, and groups the data bits into a plurality of data groups in the row and column directions according to said dimension of 8×4. For instance, the data bits DB1 to DB8 arranged in the row direction are grouped into a data group RG1; the data bits DB9 to DB16 are grouped into a data group RG2; the data bits DB17 to DB24 are grouped into a data group RG3; and the data bits DB25 to DB32 are grouped into a data group RG4. Further, the data bits DB1, DB9, DB17 and DB25 arranged in the column direction are grouped into a data group CG1; the data bits DB2, DB10, DB18 and DB26 are grouped into a data group CG2; the data bits DB3, DB11, DB19 and DB27 are grouped into a data group CG3; the data bits DB4, DB12, DB20 and DB28 are grouped into a data group CG4; the data bits DB5, DB13, DB21 and DB29 are grouped into a data group CG5; the data bits DB6, DB14, DB22 and DB30 are grouped into a data group CG6; the data bits DB7, DB15, DB23 and DB31 are grouped into a data group CG7; and the data bits DB8, DB16, DB24 and DB32 are grouped into a data group CG8.

In the present exemplary embodiment, after grouping the data bits DB1 to DB32 into the data groups RG1 to RG4 in the row direction and the data groups CG1 to CG8 in the column direction, the error checking and correcting circuit 512 encodes each of those data groups by using a bose-chaudhuri-hocquenghem code (hereinafter, referred to as BCH) algorithm as an auxiliary decoding algorithm, so as to generate the error correcting codes corresponding to the data groups. In other words, with respect to the data groups RG1 to RG4 in the row direction, the error checking and correcting circuit 512 encodes the data grouped to the data group RG1 (i.e., the data bits DB1 to DB8) by the BCH algorithm in order to generate an error correcting code BCH1 for the data corresponding to the data group RG1. By analogy, the error checking and correcting circuit 512 generates an error correcting code BCH2 corresponding to the data group RG2; generates an error correcting code BCH3 corresponding to the data group RG3; and generates an error correcting code BCH4 corresponding to the data group RG4. Further, with respect to the data groups CG1 to CG8 in the column direction, the error checking and correcting circuit 512 also generates an error correcting code BCH5 corresponding to the data group CG1; generates an error correcting code BCH6 corresponding to the data group CG2; generates an error correcting code BCH7 corresponding to the data group CG3; generates an error correcting code BCH8 corresponding to the data group CG4; generates an error correcting code BCH9 corresponding to the data group CG5; generates an error correcting code BCH10 corresponding to the data group CG6; generates an error correcting code BCH11 corresponding to the data group CG7; and generates an error correcting code BCH12 corresponding to the data group CG8. Accordingly, the data in the data groups RG1 to RG4 and the data groups CG1 to CG8 may be protected by the corresponding error correcting codes BCH1 to BCH4 and the corresponding error correcting codes BCH5 to BCH12 respectively. It should be noted that, the present invention is not limited to encode each of the data groups only by using the BCH as the auxiliary decoding algorithm. For example, in another exemplary embodiment, the error checking and correcting circuit 512 encodes each of those data groups by using a low density parity code as the auxiliary decoding algorithm.

It is worth mentioning that, in the present exemplary embodiment, although the error checking and correcting circuit 512 first groups the data bits into data groups before encoding each of the data groups to generate the error correcting codes corresponding to the data groups, the present invention is not limited thereto. For example, in another exemplary embodiment, it is possible that the error checking and correcting circuit 512 does not group the data bits into the data groups but directly performs the encoding procedure on the data bits according to an arrangement of the data bits. For instance, the error checking and correcting circuit 512 directly performs the encoding procedure on the data bits DB1 to DB8, so as to generate the error correcting code BCH1 corresponding to the data bits DB1 to DB8.

Referring to FIG. 6, in the present exemplary embodiment, the error checking and correcting circuit 512 merges the error correcting codes BCH1 to BCH12 into the error checking and correcting code ECC1 corresponding to the error checking and correcting code frame ECCF1, and stores the error checking and correcting code frame ECCF1 and the error checking and correcting code ECC1 which are encoded by the encoding procedure. Thereafter, the memory controlling circuit unit 404 (or the memory management circuit 502) may perform the decoding procedure on the error checking and correcting code frame ECCF1 through the error checking and correcting code ECC1 to read the data UD.

FIG. 8 to FIG. 17 are schematic diagrams illustrating the decoding procedure performed by using the block turbo code according to an exemplary embodiment.

Figure 8:
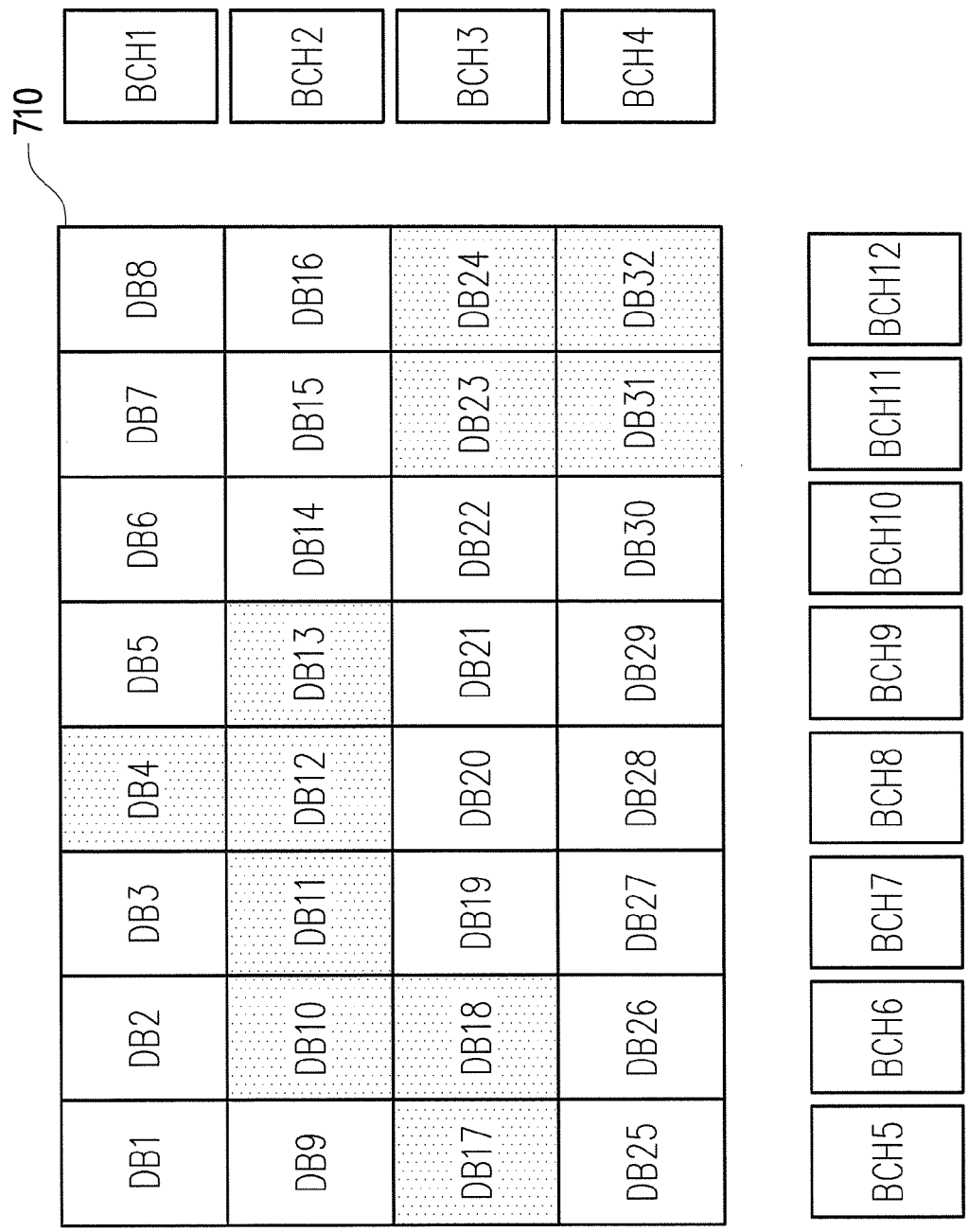

Referring to FIG. 6, FIG. 7 and FIG. 8 together, for instance, it is assumed that the memory controlling circuit unit 404 (or the memory management circuit 502) receives a read command from the host system, and the read command instructs to read the data UD from a plurality of memory cells (also known as first memory cells) in the rewritable non-volatile memory module 406. The memory controlling circuit unit 404 (or the memory management circuit 502) sends a read command sequence to obtain a data string (also known as the first data string) from the first memory cells. It should be noted that, the memory controlling circuit unit 404 (or the memory management circuit 502) uses a first read voltage to read the first memory cells according to the first read command sequence to obtain the first data string from the first memory cells.

As described above, the data UD are encoded into the error checking and correcting code frame ECCF1 by the encoding procedure. Accordingly, in the decoding procedure for the data UD, the error checking and correcting circuit 512 divides the first data string read from the first memory cells storing the error checking and correcting code frame ECCF1 into 32 data bits DB1 to DB32, and arranges the data bits DB1 to DB32 into a two dimensional data matrix 710. Herein, a dividing method for data groups corresponding to the data bits DB1 to DB32 is identical to the example in FIG. 7, which is not repeated hereinafter. The error checking and correcting circuit 512 obtains the error correcting codes BCH1 to BCH12 corresponding to each of the data groups from the error checking and correcting code ECC1 corresponding to the error checking and correcting code frame ECCF1. In the present exemplary embodiment, it is assumed that a protection capability of the error checking and correcting circuit 512 is 1 bit. In other words, if two or more error bits are present in the data in one of the data groups corresponding to the error correcting codes BCH1 to BCH12, the error checking and correcting circuit 512 is unable to successfully decode the data of said one of the data groups according to the error correcting code corresponding to said data.

For instance, it is assumed that a plurality of error bits (e.g., dotted blocks depicted in FIG. 8) are present in the first data string, and the error bits are the data bits DB4, DB10, DB11, DB12, DB13, DB17, DB18, DB23, DB24, DB31 and DB32, respectively. As described above, the protection capability of the error checking and correcting circuit 512 is 1 bit and the number of the error bits in the data group RG2 framed by the data bits DB9 to DB16 is four. Accordingly, the error checking and correcting circuit 512 is unable to decode the data of the data group RG2 corresponding to the error correcting code BCH2 according to the error correcting code BCH2. Nonetheless, the error checking and correcting circuit 512 may utilize the error correcting codes corresponding to the other data groups in an iterative manner to correct the error bits.

Figure 9:
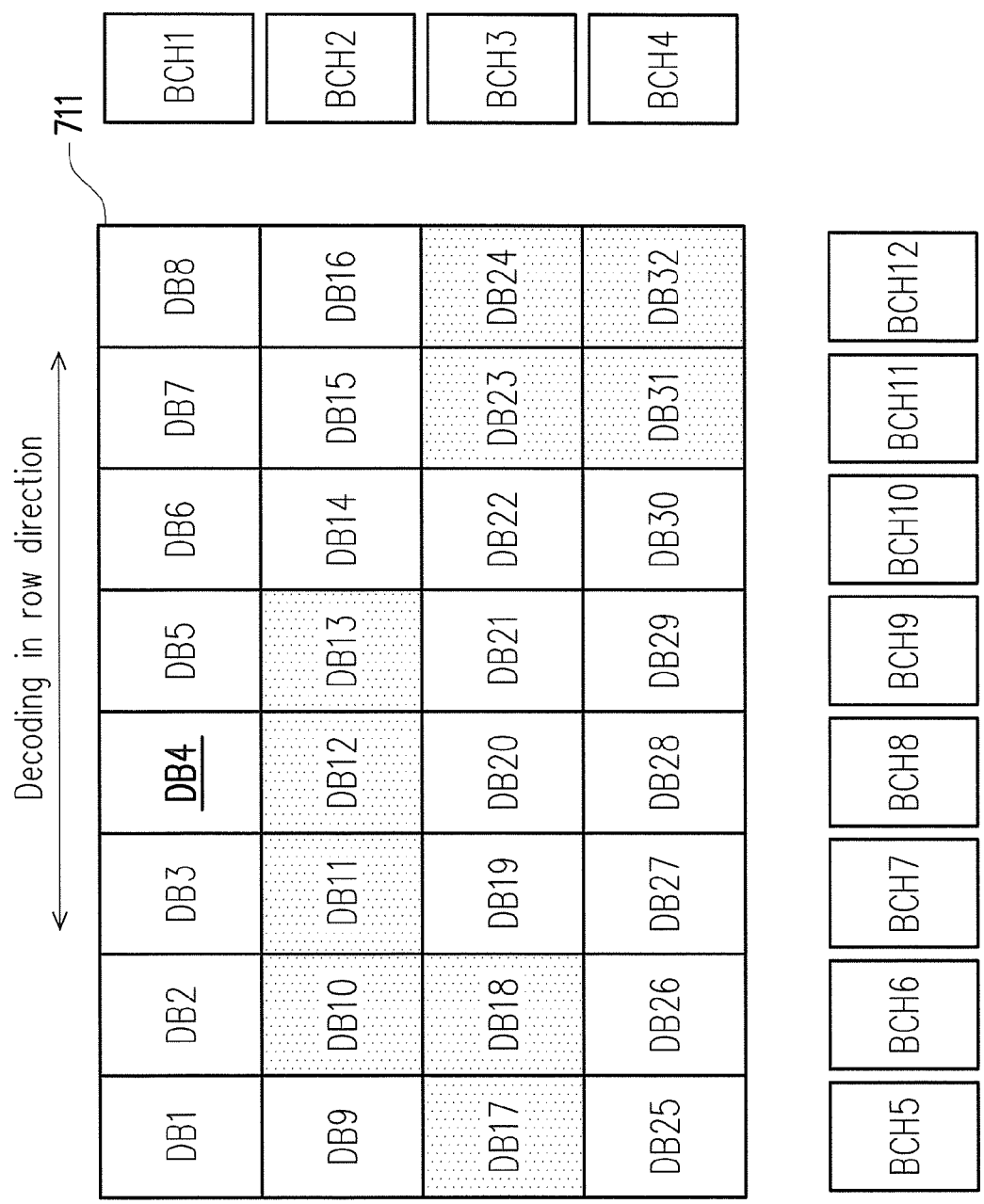

It is assumed that error checking and correcting circuit 512 first decodes a plurality of data groups formed by the data bits arranged in the row direction and the error correcting codes corresponding to these data groups, and then decodes a plurality of data groups formed by the data bits arranged in the column direction and the error correcting codes corresponding to these data group. Referring to FIG. 7, FIG. 8 and FIG. 9 together, in a first decoding procedure performed on the first data string for the first time, the error checking and correcting circuit 512 performs a first iteration decoding in the row direction for the first time. That is to say, the error checking and correcting circuit 512 decodes the data bits DB1 to DB8 by the error correcting code BCH1; decodes the data bits DB9 to DB16 by the error correcting code BCH2; decodes the data bits DB17 to DB24 by the error correcting code BCH3; and decodes the data bits DB25 to DB32 by the error correcting code BCH4. It should be noted that, aforementioned precedence of the decoding in the row direction or the decoding in the column direction is merely an example, and the present invention is not limited thereto.

Because the data group RG1 formed by the data bits DB1 to DB8 in FIG. 8 only includes one error bit (i.e., the data bit DB4 depicted in FIG. 8), the error checking and correcting circuit 512 is able to successfully decode the data of the data group RG1 according to the error correcting code BCH1 corresponding to the data group RG1. However, because the data group RG2 formed by the data bits DB9 to DB16 in FIG. 8 includes four error bits (i.e., the data bits DB10, DB11, DB12 and DB13 depicted in FIG. 8), the error checking and correcting circuit 512 is unable to decode the data of the data group RG2 according to the error correcting code BCH2 corresponding to the data group RG2. In other words, the data bits DB10 to DB13 having errors are not corrected. By analogy, after performing the first iteration decoding in the row direction of the first decoding procedure, as illustrated in FIG. 9, the error checking and correcting circuit 512 successfully corrects the data bit DB4 (represented in bold and underline) having errors and obtains a data matrix 711.

As described above, after completing the decoding in the row direction and obtaining the data matrix 711, the error checking and correcting circuit 512 performs the decoding in the column direction on the data matrix 711. That is to say, the error checking and correcting circuit 512 decodes the data bits DB1, DB9, DB17 and DB25 by the error correcting code BCH5; decodes the data bits DB2, DB10, DB18 and DB26 by the error correcting code BCH6; decodes the data bits DB3, DB11, DB19 and DB27 by the error correcting code BCH7; decodes the data bits DB4, DB12, DB20 and DB28 by the error correcting code BCH8; decodes the data bits DB5, DB13, DB21 and DB29 by the error correcting code BCH9; decodes the data bits DB6, DB14, DB22 and DB30 by the error correcting code BCH10; decodes the data bits DB7, DB15, DB23 and DB31 by the error correcting code BCH11; and decodes the data bits DB8, DB16, DB24 and DB32 by the error correcting code BCH12.

Figure 10:
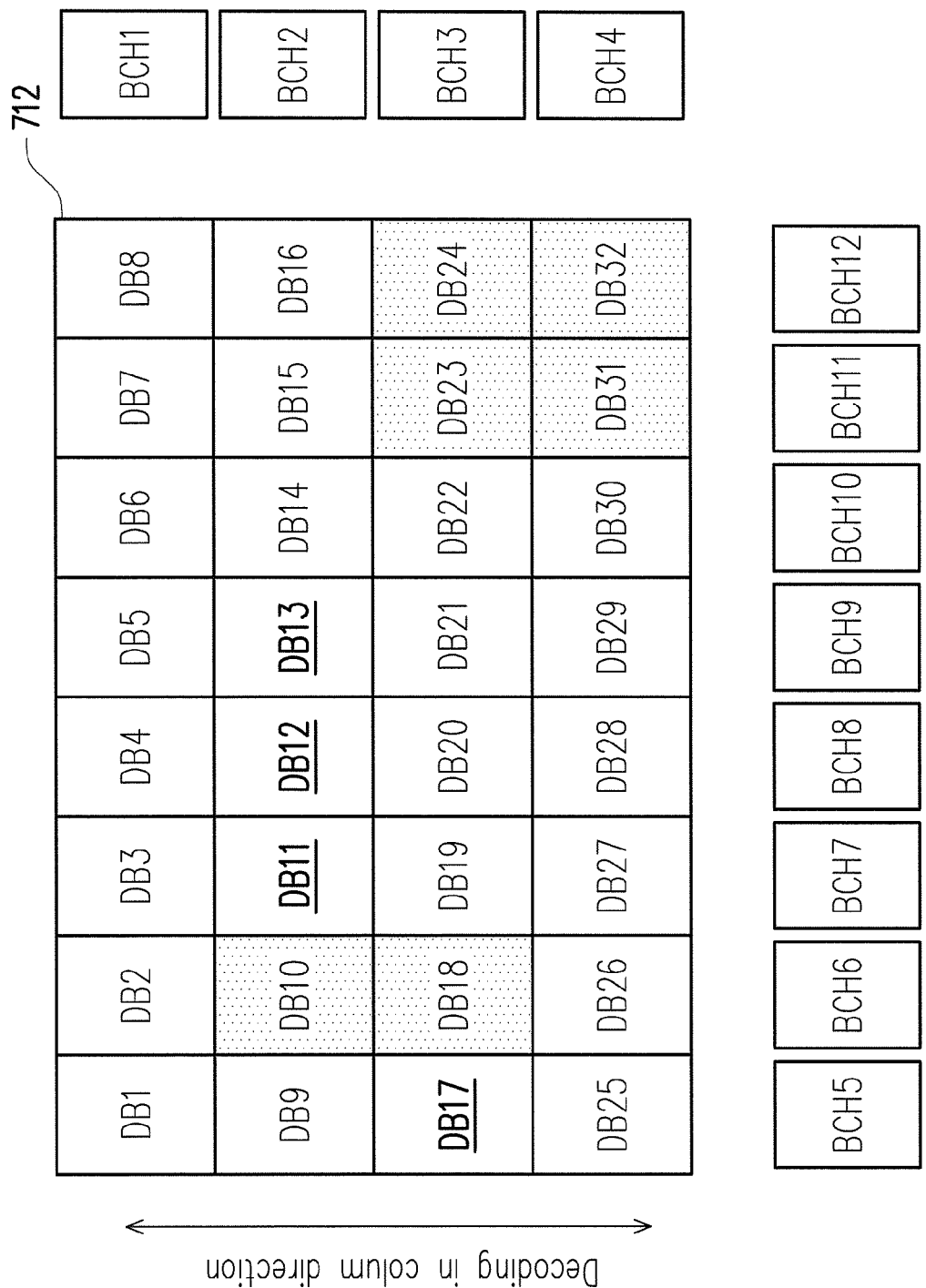

As similar to aforesaid decoding in the row direction, because the data group CG1 formed by the data bits DB1, DB9, DB17 and DB25 in FIG. 9 only includes one error bit (i.e., the data bit DB17 depicted in FIG. 9), the error checking and correcting circuit 512 is able to successfully decode the data of the data group CG1 according to the error correcting code BCH5 corresponding to the data group CG1. However, because the data group CG2 formed by the data bits DB, DB10, DB18 and DB26 in FIG. 8 includes two error bits (i.e., the data bits DB10 and DB18 depicted in FIG. 8), the error checking and correcting circuit 512 is unable to decode the data of the data group CG2 according to the error correcting code BCH6 corresponding to the data group CG2. In other words, the data bits DB10 and DB18 having errors are not corrected. By analogy, after performing a first iteration decoding in the column direction of the first decoding procedure, as illustrated in FIG. 10, the error checking and correcting circuit 512 successfully corrects the data bit DB4, DB11, DB12 and DB13 (represented in bold and underline) having errors and obtains a data matrix 712.

Figure 11:
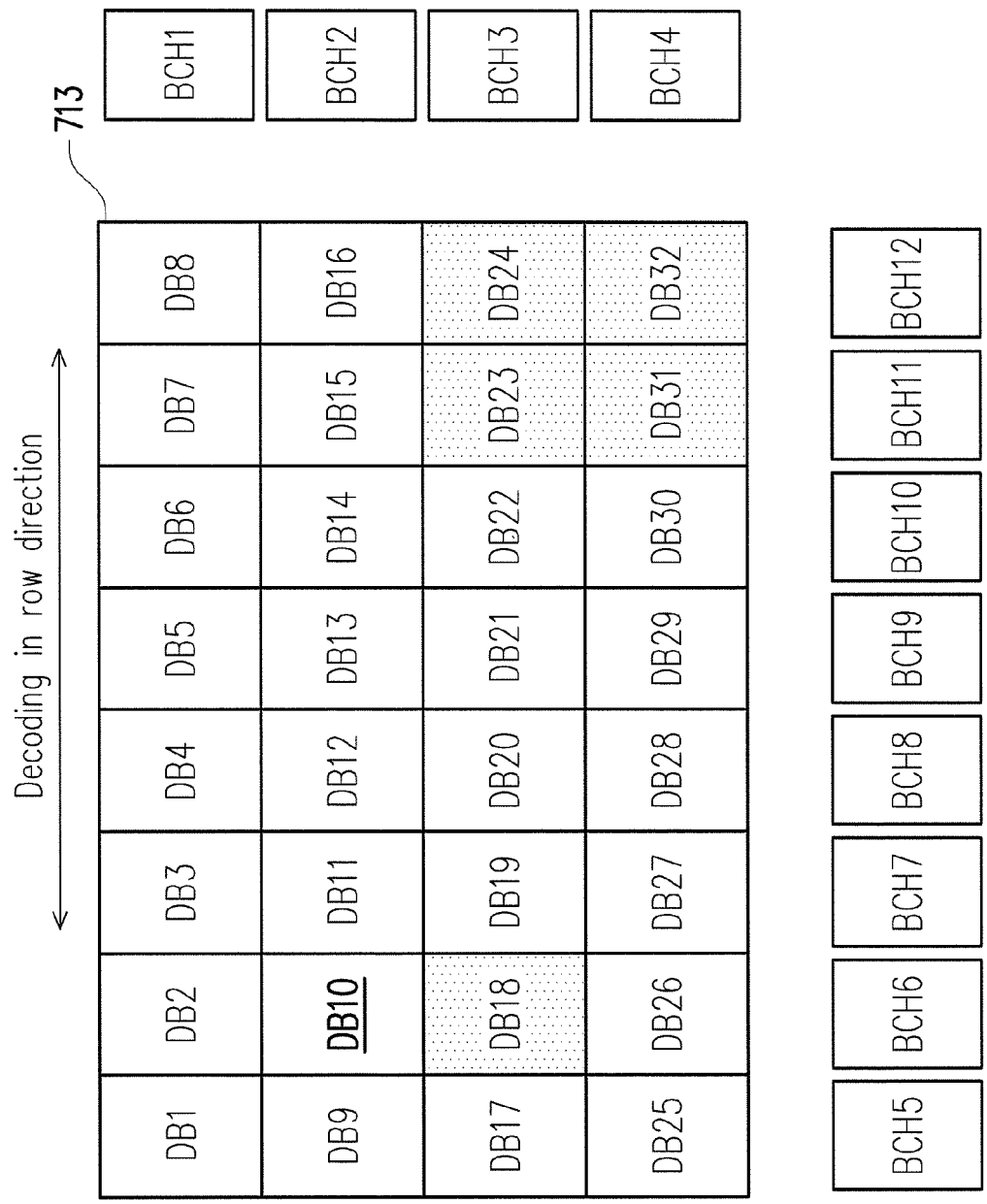

After completing the first iteration decodings in the row direction and the column direction of the first decoding procedure, the error checking and correcting circuit 512 continues to decode the data matrix 712 in the iterative manner. Similarly, the error checking and correcting circuit 512 first performs the decoding in the row direction on the data matrix 712. Referring to FIG. 10 and FIG. 11 together, after performing the first iteration decoding in the column direction of the first decoding procedure, the error checking and correcting circuit 512 successfully corrects the errors in the data bits DB11, DB12 and DB13 (which cannot be corrected by the first iteration decoding in the row direction of the first decoding procedure), so that the data group RG2 formed by the data bits DB9 to DB16 now only includes one error bit (i.e., the data bit DB10). Accordingly, later in a second iteration decoding in the row direction of the first decoding procedure, the error checking and correcting circuit 512 may decode the data group RG2 by using the error correcting code BCH2 corresponding to the data group RG2. In other words, the data bit DB10 may be successfully corrected. Referring to FIG. 11, after performing the second iteration decoding in the row direction of the first decoding procedure, the data bit DB10 is successfully corrected, only the data bits DB18, DB23, DB24, DB31 and DB32 are still the error bits, and a data matrix 713 is generated.

Figure 12:
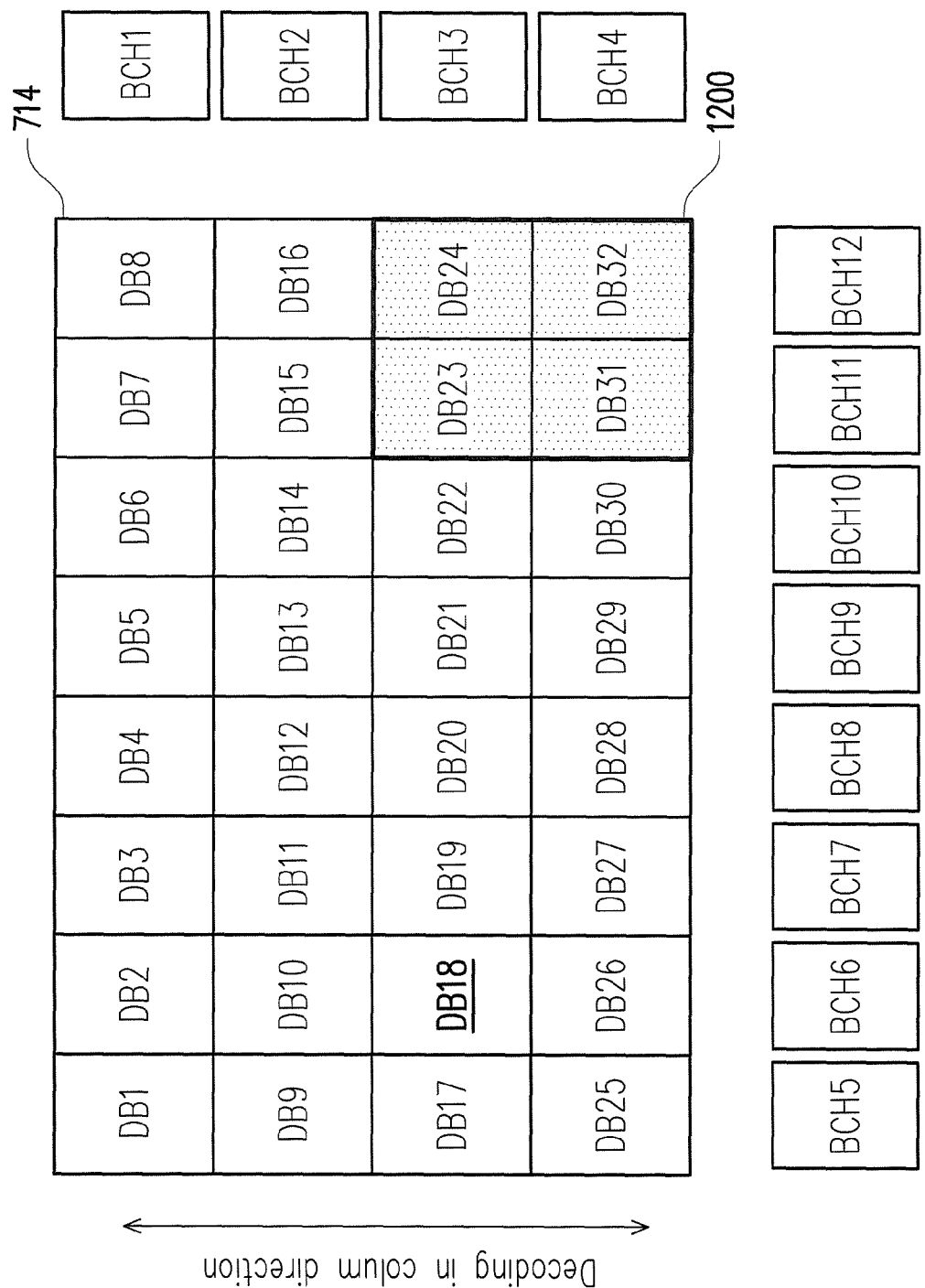

Similarly, after completing the second iteration decoding in the row direction of the first decoding procedure, the error checking and correcting circuit 512 continues to decode the data matrix 713 by performing a second iteration decoding in the column direction of the first decoding procedure. Referring to FIG. 10, FIG. 11 and FIG. 12, originally, in FIG. 10, the data bits DB10 and DB18 having errors cannot be corrected by the first iteration decoding in the column direction of the first decoding procedure. However, the data bit DB10 is successfully corrected by the second iteration decoding in the row direction of the first decoding procedure, and accordingly, the data group CG2 formed by the data bits DB2, DB10, DB18 and DB26 arranged in the column direction now only includes one error bit (e.g., the data bit DB18 depicted in FIG. 11). Accordingly, later in a second iteration decoding in the column direction of the first decoding procedure in FIG. 12, the error checking and correcting circuit 512 may correct the data bit DB18 having errors by using the error correcting code BCH6 corresponding to the data group CG2. Referring to FIG. 12, after completing the second iteration decoding in the column direction of the first decoding procedure, only the data bits DB23, DB24, DB31 and DB32 are still the error bits, and a data matrix 714 is generated.

It should be noted that, as similar to aforementioned steps, the error checking and correcting circuit 512 re-performs the iteration decodings in the row direction and the column direction once again on the data matrix 714, and yet the data bits DB23, DB24, DB31 and DB32 having errors still cannot be successfully corrected. In other words, the data matrix 714 is a final decoding result of the decoding procedure this time. The error checking and correcting circuit 512 outputs the data matrix 714, and the memory controlling circuit unit 404 (or the memory management circuit 502) uses the data matrix 714 as a decoded first data string corresponding to the first data string.

Because there is still the data bits that cannot be successfully corrected in the decoded first data string of the final decoding result of the decoding procedure this time, in the present exemplary embodiment, the memory controlling circuit unit 404 (or the memory management circuit 502) continues to process the decoded first data string. First, the memory controlling circuit unit 404 (or the memory management circuit 502) determines a plurality of unrecognized data in the decoded first data string and a plurality of unrecognized data addresses corresponding to the unrecognized data. Specifically, the memory controlling circuit unit 404 (or the memory management circuit 502) is able to determine that the data bits which are successfully decoded in the decoded first data string (i.e., the data matrix 714) are the data bits DB1 to DB22 and DB25 to DB30, but the memory controlling circuit unit 404 (or the memory management circuit 502) is unable to determine whether errors are present in all of the data bits DB23, DB24, DB31 and DB32. Accordingly, the memory controlling circuit unit 404 (or the memory management circuit 502) identifies the data bits DB23, DB24, DB31 and DB32 as the unrecognized data, and uses addresses corresponding to the unrecognized data as unrecognized data addresses 1200 (e.g., an area 1200 in black box depicted in FIG. 12).

In the present exemplary embodiment, if the error bit is present in the decoded first string, the memory controlling circuit unit 404 (or the memory management circuit 502) sends another read command sequence (also known as a second read command sequence) to obtain a data string (also known as a second data string) again from the first memory cells. For example, in an exemplary embodiment, the memory controlling circuit unit 404 (or the memory management circuit 502) uses a second read voltage to read the first memory cells according to the second read command sequence to obtain the second data string from the first memory cells, and a voltage value of the second read voltage is equal to a voltage value of the first read voltage. However, it should be understood that, it is also possible that the voltage value of the second read voltage is not equal to the voltage value of the first read voltage. For example, in another exemplary embodiment, before using the second read voltage to read the first memory cells, the memory controlling circuit unit 404 (or the memory management circuit 502) first detects a threshold voltage distribution of the first memory cells, and then uses a proper voltage value of the second read voltage to read the first memory cells according to a detection result (e.g., an offset amount of the threshold voltage distribution). Herein, the voltage value of the second read voltage is different from the voltage value of the first read voltage. Accordingly, the memory controlling circuit unit 404 (or the memory management circuit 502) is able to identify a storage state of the first memory cells more correctly. It should be noted that, the present invention is not intend to lime an adjusting method for the voltage value of the second read voltage. For example, the memory controlling circuit unit 404 (or the memory management circuit 502) may not need to perform said detection, but simply adjust the voltage value of the second read voltage according to a predetermined read voltage adjustment table.

Referring to FIG. 13, as similar to aforesaid steps, the memory controlling circuit unit 404 (or the memory management circuit 502) arranges the second data string into a data matrix 720. It is assumed that a plurality of error bits is present in the second data string (i.e., the data matrix 720), and the error bits are the data bits DB4, DB10 to DB13, DB16, DB17 to DB18, DB23 to DB24 and DB30 to DB31.

Figure 14:
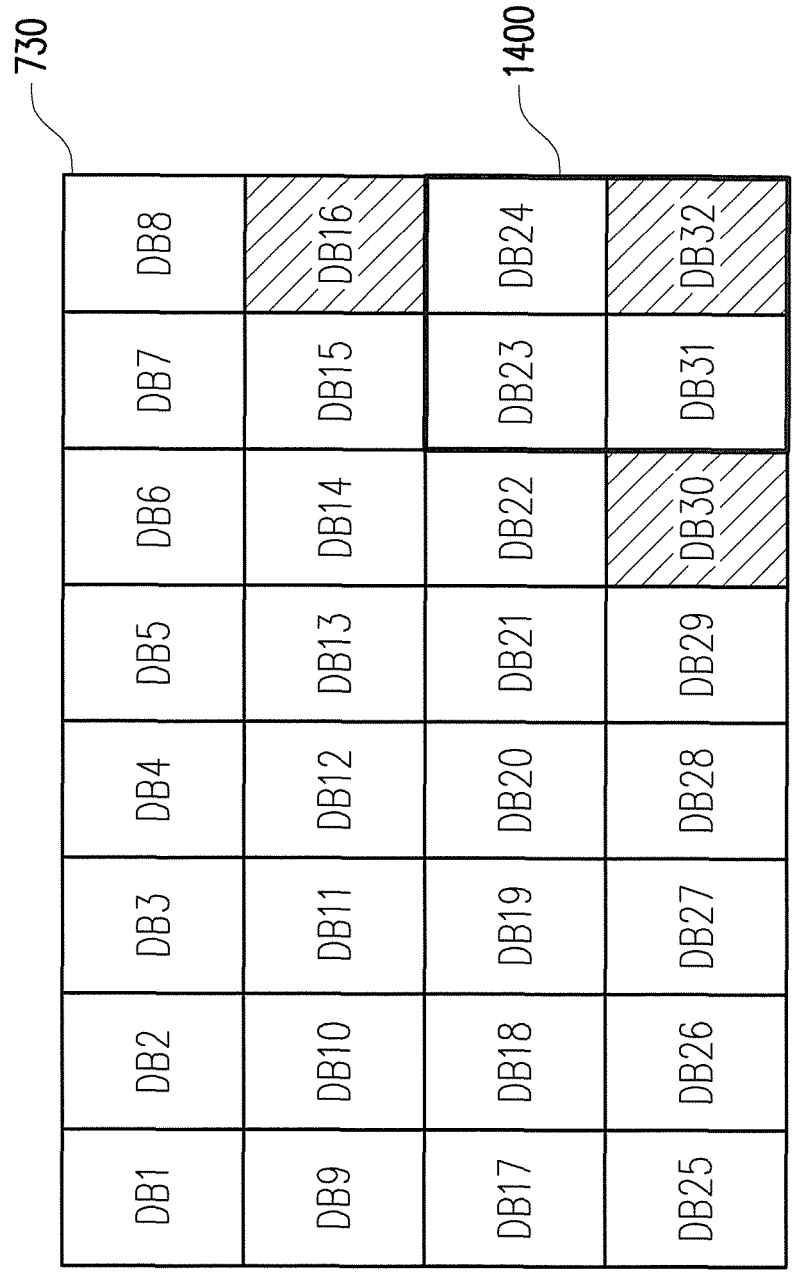

Referring to FIG. 12, FIG. 13 and FIG. 14 together, the memory controlling circuit unit 404 (or the memory management circuit 502) performs an exclusive or operation on the decoded first data string (i.e., the data matrix 714) obtained in the previous decoding procedure and the second data string (i.e., the data matrix 720) to obtain an adjusting data string (a data matrix 730 depicted in FIG. 14), so as to determine differences between the second data string and the decoded first data string (e.g., the data bits DB16, DB30 and DB32 having slash lines depicted in FIG. 14).

In the present exemplary embodiment, the memory controlling circuit unit 404 (or the memory management circuit 502) adjusts the decoded first data string according to the adjusting data string to obtain an adjusted first data string.

Specifically, first, the memory controlling circuit unit 404 (or the memory management circuit 502) identifies data 1400 (e.g., an area 1400 in black box depicted in FIG. 14) corresponding to the unrecognized data addresses in the adjusting data string according to the unrecognized data and the unrecognized data addresses identified in the decoded first data string.

Subsequently, referring to FIG. 12, FIG. 14 and FIG. 15 together, the memory controlling circuit unit 404 (or the memory management circuit 502) performs an exclusive or operation on the unrecognized data 1200 in the decoded first data string by using the data 1400 corresponding to the unrecognized data in the adjusting data string in order to adjust the decoded first data string into the adjusted first data string (i.e., a data matrix 740 in FIG. 15). In other words, the memory controlling circuit unit 404 (or the memory management circuit 502) does not adjust the data bits which are already successfully corrected in the decoded first string, but adjusts the unrecognized data of the decoded first data string by using data differences on the unrecognized data addresses of the decoded data string and the second data string. Accordingly, the memory controlling circuit unit 404 (or the memory management circuit 502) may continue to perform the decoding procedure (i.e., a second decoding procedure) on the adjusted first data string (i.e., the data string 740) obtained by adjusting the decoded first data string (i.e., the data string 714).

Figure 15:
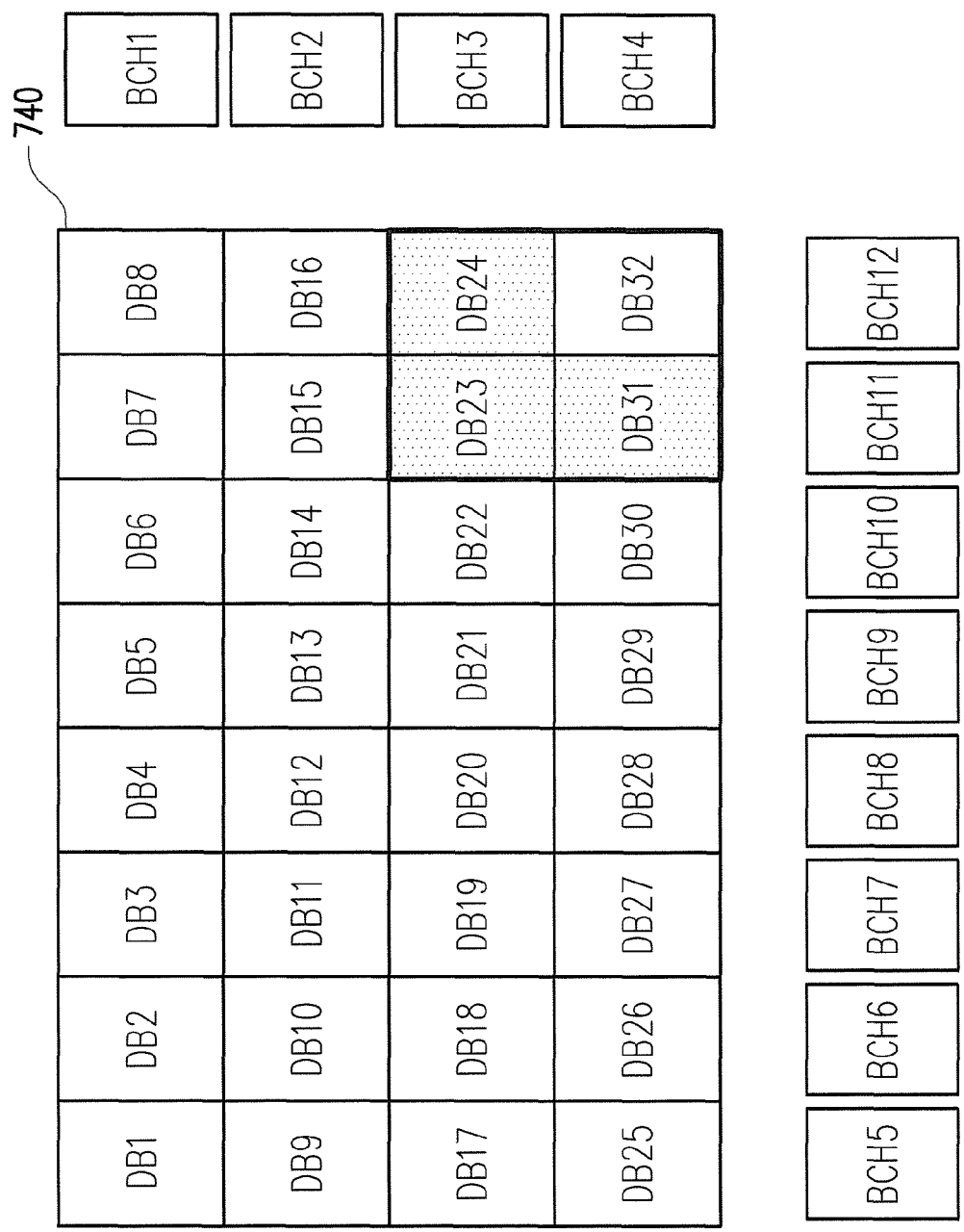
Figure 16:
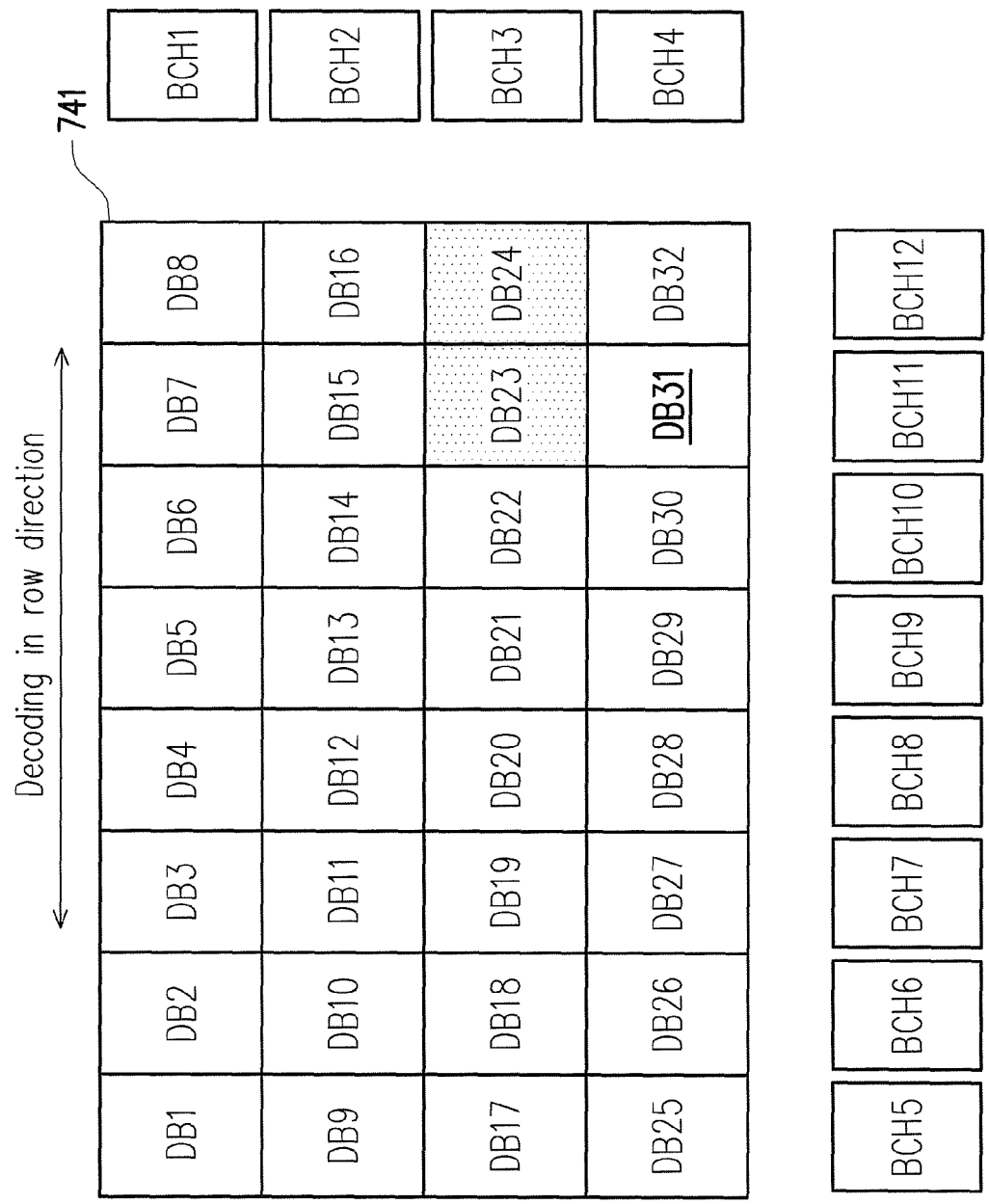

Referring to FIG. 15 and FIG. 16 together, the decoded first data string becomes the adjusted first data string through the adjustment of the adjusting data string, and the data group originally formed by the data bits DB25 to DB32 having two error bits (i.e., data bits DB31 and DB32) in the decoded first data string (i.e., the data matrix 714) becomes the data group only having one error bit (i.e., the data bit DB31) in the adjusted first data string (i.e., the data matrix 740). In other words, the data bits DB24 to DB32 only having one error bit in the adjusted first data string (i.e., the data matrix 740) in FIG. 15 may be corrected by using the error correcting code BCH4. As similar to aforesaid steps, after performing a first iteration decoding in the row direction of the second decoding procedure, the data bit DB31 originally having errors is successfully corrected so leaves only the data bits DB23 and DB24 are the error bits, and a data matrix 741 is generated.

Figure 17:
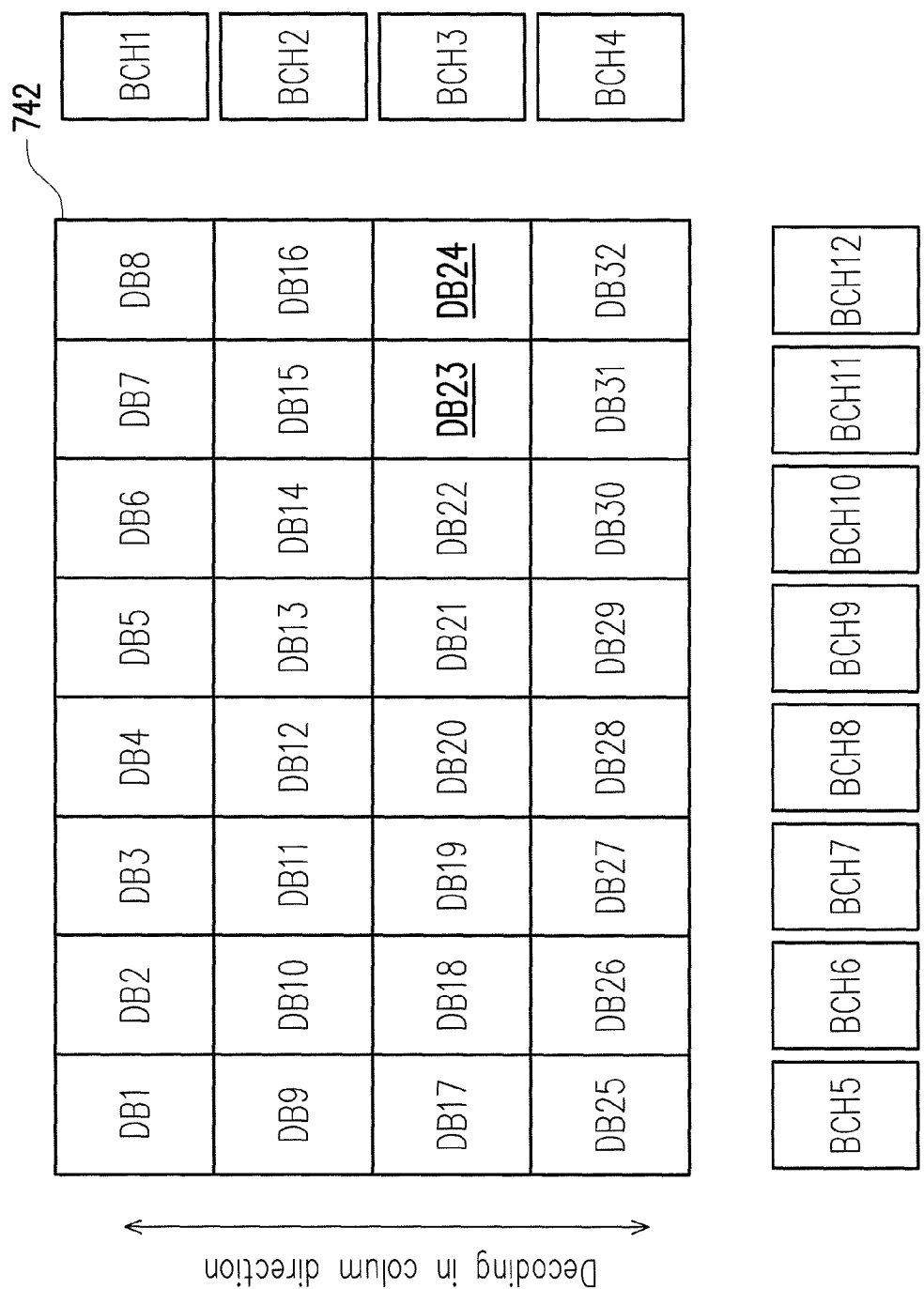

Referring to FIG. 16 and FIG. 17 together, as similar to aforesaid steps, the memory controlling circuit unit 404 (or the memory management circuit 502) continues to perform the decoding in the column direction. After performing a first iteration decoding in the column direction of the second decoding procedure, the data bits DB23 and DB24 are also successfully corrected, and a data matrix 742 not having any error bit is generated. The error checking and correcting circuit 512 then converts the data matrix 742 which is successfully corrected into the decoded first data string for outputting. For example, the decoded first data string is forming by sequentially arranging the data bits DB1 to DB32 which are successfully decoded. For example, the memory controlling circuit unit 404 (or the memory management circuit 502) determines whether the error bit is present in the decoded first data string. Because there is no an error bit in the decoded first data string (i.e., the data matrix 742), the memory controlling circuit unit 404 (or the memory management circuit 502) uses the decoded first data string as a corrected data to be sent to the host system in response to the read command.

It is worth mentioning that, aforementioned method for dividing the data string read from the first memory cells into 32 data bits and arranging the data bits into the two dimensional data matrix of 8×4 is only for example, and the present invention is not limited thereto. For example, in other embodiments, the data string read from the first memory cells may be divided into the data bits with the amount less than 32 or more than 32, and the data bits being divided may be arranged into two dimensional or three dimensional data matrices of any aspect ratio. Subsequently, the error correcting encoding or decoding procedures are performed on the data groups to which the data bits belong, so as to obtain the error correcting codes corresponding to the data groups or correct the data bits having errors.

It should be noted that, the memory controlling circuit unit 404 (or the memory management circuit 502) further records the number of times for performing the decoding procedure on the adjusted first data string. If said number of timers is greater than a predetermined number of times, the memory controlling circuit unit 404 (or the memory management circuit 502) sends an error message to the host system in response to the read command, where the error message is used to indicate that the data to which the read command intends to read cannot be read. In other words, if the adjusted data strings, which are obtained from the data strings obtained by the reading the first memory cells again and the decoded first data string obtained by performing the previous decoding procedure, cannot be successfully decoded, the memory controlling circuit unit 404 (or the memory management circuit 502) no longer attempts to adjust the decoded first data string (i.e, stops performing the decoding procedure on the obtained data string) and sends the error message to the host system. It should be noted that, manufacturers may set a value of the predetermined number of timers based on their own demands.

Figure 18:
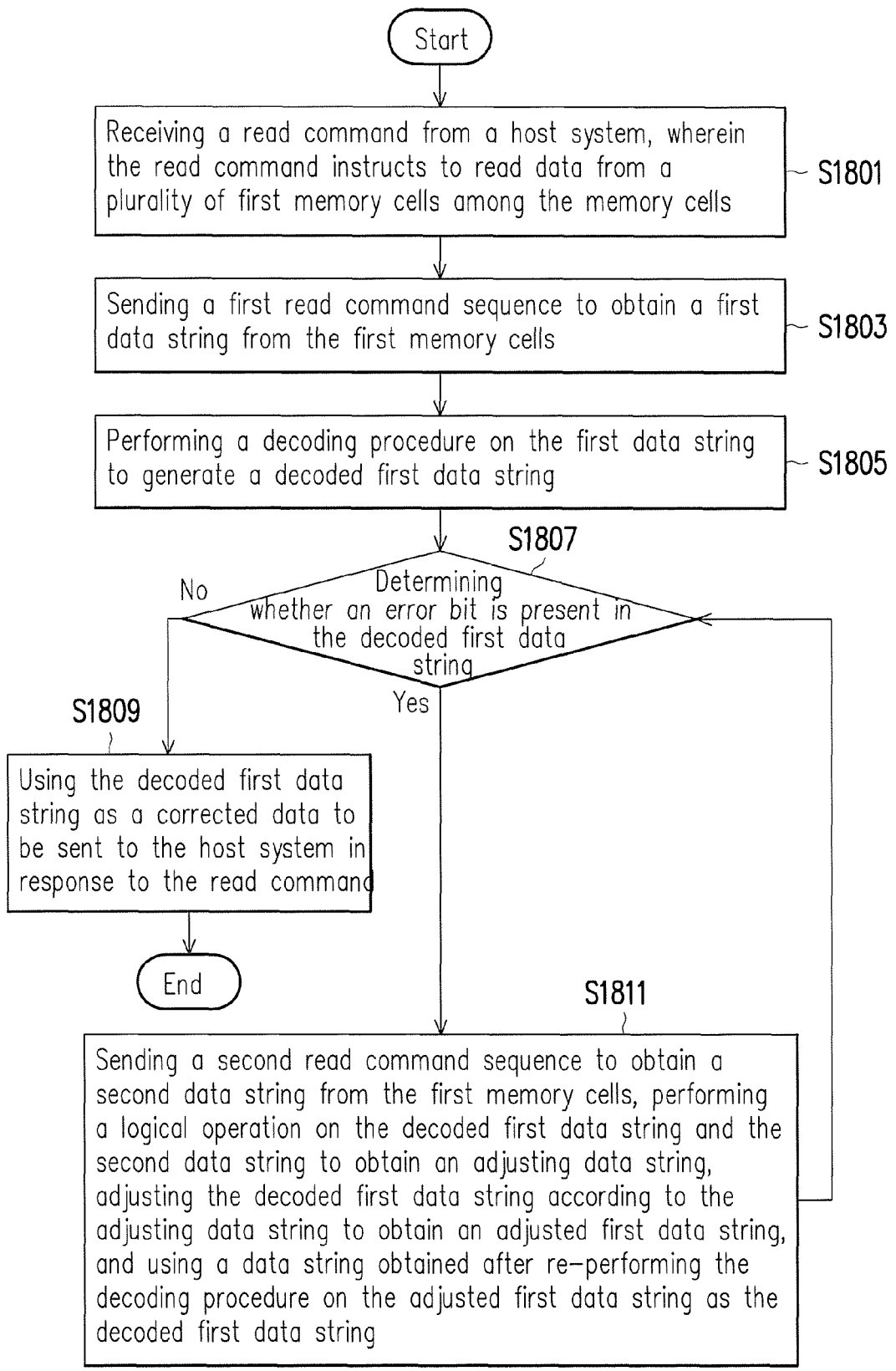
FIG. 18 is a flowchart illustrating a data reading method according to an exemplary embodiment.

FIG. 18 is a flowchart illustrating a data reading method according to an exemplary embodiment.

First of all, in step S1801, the memory controlling circuit unit 404 (or the memory management circuit 502) receives a read command from a host system, wherein the read command instructs to read data from a plurality of first memory cells among the memory cells. In step S1803, the memory controlling circuit unit 404 (or the memory management circuit 502) sends a first read command sequence to obtain a first data string from the first memory cells.

In step S1805, the memory controlling circuit unit 404 (or the memory management circuit 502) performs a decoding procedure on the first data string to generate a decoded first data string. In step S1807, the memory controlling circuit unit 404 (or the memory management circuit 502) determines whether there is an error bit in the decoded first data string.

If there is no error bit in the decoded first data string, in step S1809, the memory controlling circuit unit 404 (or the memory management circuit 502) uses the decoded first data string as a corrected data to be sent to the host system in response to the read command, and ends the entire process. If there is an error bit in the decoded first data string, in step S1811, the memory controlling circuit unit 404 (or the memory management circuit 502) sends a second read command sequence to obtain a second data string from the first memory cells, performs a logical operation on the decoded first data string and the second data string to obtain an adjusting data string, adjusts the decoded first data string according to the adjusting data string to obtain an adjusted first data string, uses a data string obtained after re-performing the decoding procedure on the adjusted first data string as the decoded first data string, and proceeds to execute step S1807.

In summary, other than using the block turbo code for the encoding procedure to protect the data, the data reading method, the memory controlling circuit unit and the memory storage device as provided in the present invention are capable of re-performing the decoding on the data which are not successfully decoded by reading the data again during the process of decoding in order to successfully decode and read the data, so as to improve the correctness in reading data and the protection capability for the stored data.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A data reading method for a rewritable non-volatile memory module, wherein the rewritable non-volatile memory module comprises a plurality of memory cells, and the data reading method comprising:
   receiving a read command from a host system, wherein the read command instructs to read data from a plurality of first memory cells among the memory cells;
   sending a first read command sequence to obtain a first data string from the first memory cells;
   performing a decoding procedure on the first data string to generate a decoded first data string;
   if there is no error bit in the decoded first data string, using the decoded first data string as a corrected data to be sent to the host system in response to the read command; and
   if there is an error bit in the decoded first data string, sending a second read command sequence to obtain a second data string from the first memory cells, performing a logical operation on the decoded first data string and the second data string to obtain an adjusting data string, adjusting the decoded first data string according to the adjusting data string to obtain an adjusted first data string, and using a data string obtained after re-performing the decoding procedure on the adjusted first data string as the decoded first data string,
   wherein the step of adjusting the decoded first data string according to the adjusting data string to obtain the adjusted first data string comprises:
      identifying a plurality of unrecognized data in the decoded first data string and a plurality of unrecognized data addresses corresponding to the unrecognized data; and
      performing an exclusive or operation on the unrecognized data in the decoded first data string by using data corresponding to the unrecognized data in the adjusting data string to adjust the decoded first data string to obtain the adjusted first data string.

2. The data reading method of claim 1, wherein the step of sending the first read command sequence to obtain the first data string from the first memory cells comprises:
   using a first read voltage to read the first memory cells according to the first read command sequence to obtain the first data string from the first memory cells,
   wherein the step of sending the second read command sequence to obtain the second data string from the first memory cells comprises:
   using a second read voltage to read the first memory cells according to the second read command sequence to obtain the second data string from the first memory cells, wherein a voltage value of the second read voltage is not equal to a voltage value of the first read voltage.

3. The data reading method of claim 1, wherein the step of performing the logical operation on the decoded first data string and the second data string to obtain the adjusting data string comprises:
   performing an exclusive or operation on the decoded first data string and the second data string to generate the adjusting data string.

4. The data reading method of claim 1, further comprising:
   recording the number of times for performing the decoding procedure on the adjusted first data string; and
   if the number of times is greater than a predetermined number of times, sending an error message to the host system.

5. The data reading method of claim 1, wherein the step of performing the decoding procedure on the first data string to generate the decoded first data string comprises:
   performing the decoding procedure by using a block turbo code algorithm.

6. The data reading method of claim 5, wherein the step of performing the decoding procedure by using the block turbo code algorithm comprises:
   using a bose-chaudhuri-hocquenghem code algorithm or a low density parity code algorithm as an auxiliary decoding algorithm on the first data string in an iterative manner to obtain a final decoding result corresponding to the first data string; and
   using the final decoding result as the decoded first data string.

7. A memory controlling circuit unit controlling a rewritable non-volatile memory module, and the memory controlling circuit unit comprising:
   a host interface configured to couple to a host system;
   a memory interface configured to couple to the rewritable non-volatile memory module, wherein the rewritable non-volatile memory module has a plurality of memory cells; and
   a memory management circuit coupled to the host interface and the memory interface,
   wherein the memory management circuit is configured to receive a read command from the host system, wherein the read command instructs to read data from a plurality of first memory cells among the memory cells,
   wherein the memory management circuit is further configured to send a first read command sequence to obtain a first data string from the first memory cells,
   wherein the memory management circuit is further configured to perform a decoding procedure on the first data string to generate a decoded first data string,
   wherein if there is no error bit in the decoded first data string, the memory management circuit is further configured to use the decoded first data string as a corrected data to be sent to the host system in response to the read command,
   wherein if there is an error bit in the decoded first data string, the memory management circuit is further configured to send a second read command sequence to obtain a second data string from the first memory cells, perform a logical operation on the decoded first data string and the second data string to obtain an adjusting data string, adjust the decoded first data string according to the adjusting data string to obtain an adjusted first data string, and use a data string obtained after re-performing the decoding procedure on the adjusted first data string as the decoded first data string, wherein in the operation of adjusting the decoded first data string according to the adjusting data string to obtain the adjusted first data string, the memory management circuit identifies a plurality of unrecognized data in the decoded first data string and a plurality of unrecognized data addresses corresponding to the unrecognized data, and performs an exclusive or operation on the unrecognized data in the decoded first data string by using data corresponding to the unrecognized data in the adjusting data string to adjust the decoded first data string to obtain the adjusted first data string.

8. The memory controlling circuit unit of claim 7, wherein in the operation of sending the first read command sequence to obtain the first data string from the first memory cells, the memory management circuit uses a first read voltage to read the first memory cells according to the first read command sequence to obtain the first data string from the first memory cells, wherein in the operation of sending the second read command sequence to obtain the second data string from the first memory cells, the memory management circuit uses a second read voltage to read the first memory cells according to the second read command sequence to obtain the second data string from the first memory cells, wherein a voltage value of the second read voltage is not equal to a voltage value of the first read voltage.

9. The memory controlling circuit unit of claim 7, wherein in the operation of performing the logical operation on the decoded first data string and the second data string to obtain the adjusting data string, the memory management circuit performs an exclusive or operation on the decoded first data string and the second data string to generate the adjusting data string.

10. The memory controlling circuit unit of claim 7, wherein the memory management circuit records the number of times for performing the decoding procedure on the adjusted first data string, if the number of times is greater than a predetermined number of times, the memory management circuit sends an error message to the host system.

11. The memory controlling circuit unit of claim 7, wherein in the operation of performing the decoding procedure on the first data string to generate the decoded first data string, the memory management circuit performs the decoding procedure by using a block turbo code algorithm.

12. The memory controlling circuit unit of claim 11, wherein in the operation of performing the decoding procedure by using the block turbo code algorithm, the memory management circuit uses a bose-chaudhuri-hocquenghem code algorithm or a low density parity code algorithm as an auxiliary decoding algorithm on the first data string in an iterative manner to obtain a final decoding result corresponding to the first data string, wherein the memory management circuit uses the final decoding result as the decoded first data string.

13. A memory storage device, comprising:

a connection interface unit configured to couple to a host system;

a rewritable non-volatile memory module, wherein the rewritable non-volatile memory module has a plurality of memory cells; and a memory controlling circuit unit, coupled to the connection interface unit and the rewritable non-volatile memory module, wherein the memory controlling circuit unit is configured to receive a read command from the host system, wherein the read command instructs to read data from a plurality of first memory cells among the memory cells, wherein the memory controlling circuit unit is further configured to send a first read command sequence to obtain a first data string from the first memory cells, wherein the memory controlling circuit unit is further configured to perform a decoding procedure on the first data string to generate a decoded first data string, wherein if there is no error bit in the decoded first data string, the memory controlling circuit unit is further configured to use the decoded first data string as a corrected data to be sent to the host system in response to the read command, wherein if there is an error bit in the decoded first data string, the memory controlling circuit unit is further configured to send a second read command sequence to obtain a second data string from the first memory cells, perform a logical operation on the decoded first data string and the second data string to obtain an adjusting data string, adjust the decoded first data string according to the adjusting data string to obtain an adjusted first data string, and use a data string obtained after re-performing the decoding procedure on the adjusted first data string as the decoded first data string, wherein in the operation of adjusting the decoded first data string according to the adjusting data string to obtain the adjusted first data string, the memory controlling circuit unit identifies a plurality of unrecognized data in the decoded first data string and a plurality of unrecognized data addresses corresponding to the unrecognized data and performs an exclusive or operation on the unrecognized data in the decoded first data string by using data corresponding to the unrecognized data in the adjusting data string to adjust the decoded first data string to obtain the adjusted first data string.

14. The memory storage device of claim 13, wherein in the operation of sending the first read command sequence to obtain the first data string from the first memory cells, the memory controlling circuit unit uses a first read voltage to read the first memory cells according to the first read command sequence to obtain the first data string from the first memory cells, in the operation of sending the second read command sequence to obtain the second data string from the first memory cells, the memory controlling circuit unit uses a second read voltage to read the first memory cells according to the second read command sequence to obtain the second data string from the first memory cells, wherein a voltage value of the second read voltage is not equal to a voltage value of the first read voltage.

15. The memory storage device of claim 13, wherein in the operation of performing the logical operation on the decoded first data string and the second data string to obtain the adjusting data string, the memory controlling circuit unit performs an exclusive or operation on the decoded first data string and the second data string to generate the adjusting data string.

16. The memory storage device of claim 13, wherein the memory controlling circuit unit records the number of times for performing the decoding procedure on the adjusted first data string, if the number of times is greater than a predetermined number of times, the memory controlling circuit unit sends an error message to the host system.

17. The memory storage device of claim 13, wherein in the operation of performing the decoding procedure on the first data string to generate the decoded first data string, the memory controlling circuit unit performs the decoding procedure by using a block turbo code algorithm.

18. The memory storage device of claim 17, wherein in the operation of performing the decoding procedure by using the block turbo code algorithm,
the memory controlling circuit unit uses a bose-chaudhuri-hocquenghem code algorithm or a low density parity code algorithm as an auxiliary decoding algorithm on the first data string in an iterative manner to obtain a final decoding result corresponding to the first data string,
wherein the memory controlling circuit unit uses the final decoding result as the decoded first data string.

* * * * *